United States Patent
Kimoto

Patent Number: 5,869,884
Date of Patent: Feb. 9, 1999

[54] SEMICONDUCTOR DEVICE HAVING LEAD TERMINAL ON ONLY ONE SIDE OF A PACKAGE

[75] Inventor: Hisamitsu Kimoto, Tokyo, Japan

[73] Assignee: NEC Corporation, Tokyo, Japan

[21] Appl. No.: 883,437

[22] Filed: Jun. 26, 1997

[30] Foreign Application Priority Data

Jun. 27, 1996 [JP] Japan ................................ 8-167283

[51] Int. Cl.$^6$ .................. H01L 23/495; H01L 23/48; H01L 23/52
[52] U.S. Cl. .................. 257/670; 257/690; 257/694; 257/695
[58] Field of Search .................. 257/670, 690, 257/694, 695

[56] References Cited

U.S. PATENT DOCUMENTS 4,860,087  8/1989  Matsubara et al. .
5,150,194  9/1992  Brooks et al. .
5,304,737  4/1994  Kim .

FOREIGN PATENT DOCUMENTS 55-59749   5/1980  Japan .
63-199450  8/1988  Japan .
4-63444    2/1992  Japan .

Primary Examiner—Stephen D. Meier
Attorney, Agent, or Firm—Whitham, Curtis & Whitham

[57] ABSTRACT

A semiconductor device of the present invention in which a plurality of lead terminals are provided for only one side, comprising a plurality of leads connected to the lead terminals, a semiconductor chip provided on an island and having a plurality of pads electrically connected to the leads on one side, a first extension lead which is connected to one lead terminal among the leads and at least a part of which is provided along a side of the semiconductor chip perpendicular to the side of it having the pads, a second extension lead at least a part of which is provided for a side of the semiconductor chip opposite to the side of it having the pads, and a suspension pin provided between one end of the first extension lead and one end of the second extension lead and connected to the island. The semiconductor chip includes a power-supply-voltage provided for a side of the semiconductor chip opposite to the side of it having the pad and pad electrically connected with the other end of the second extension lead, a first auxiliary pad provided for a side of the semiconductor chip other than the side of it having the pads and electrically connected to one end of the first extension lead and a second auxiliary pad electrically connected to one end of the second extension lead, and wiring connecting the first auxiliary pad with the second auxiliary pad.

7 Claims, 5 Drawing Sheets

5,869,884

SEMICONDUCTOR DEVICE HAVING LEAD TERMINAL ON ONLY ONE SIDE OF A PACKAGE

BACKGROUND OF THE INVENTION

1. Field of the Invention

The present invention relates to a semiconductor device, particularly to a semiconductor device having a lead terminal on only one side of a package.

2. Description of the Related Art

As shown in FIG. 1, a conventional semiconductor device is formed by radially connecting a lead 21 protruded from a margin 29a inside of a body to the inside 29 of the body with a pad 24 on a semiconductor chip 22 by a bonding wire 23. Therefore, the pattern of the lead 21 has a regular simple shape. Thus, it is possible to easily set a suspension pin 26 for holding an island 25 to mount a semiconductor chip 22 inside of the body 29 between patterns of the lead 21 and at four sides of the island 25 as illustrated. As a result, the island 25 is stably located without tilting in a resin sealing step and therefore, it is possible to easily form a package.

However, because an electronic unit circuit has more complicated and advanced functions, to attain high speed operation and reduction of the mounting area, the lead terminal of a package and the arrangement of pads of a semiconductor chip are specialized and the pattern of a lead frame is complicated. For example, as shown in FIG. 2, there is a case in which a lead terminal 30 is provided for only one side of a package, e.g., a zigzag inline package (ZIP). In this case, because it is necessary for a power-supply terminal pad to stably supply a power supply voltage to the whole of a chip 32, a power-supply-voltage pad 34b is also present on the side opposite to the lead terminal side. To bond the opposite-side pad 34b, it is necessary to extend the lead frame from the side where the lead terminal 30 is present and arrange a lead 31a enclosing the chip 32. Therefore, it is impossible to provide a suspension pin 36 for holding an island 35 for necessary portions around the island, that is, right and left sides of an island 35 in this case.

In the case of the above-described conventional semiconductor device, when the lead terminal 30 can be provided for only one side of the package and the pad on the chip is also present on the side opposite to the lead terminal, it is necessary to arrange leads extended so as to enclose the chip by extending the lead frame from the side where the lead terminal is present. Therefore, it is impossible to provide a joint (suspension pin) for holding the island for necessary portions around the island. Thus, there is a disadvantage that the number of joints decreases, the island becomes unstable and tilts in the resin sealing step, and finally the island protrudes from the package.

BRIEF SUMMARY OF THE INVENTION

Objects of the Invention

Therefore, it is an object of the present invention to provide a semiconductor device making it possible to set a suspension pin for securing an island to necessary portions of the island even when a lead terminal is provided for only one side of a package.

Summary of the Invention

A semiconductor device of the present invention having a plurality of lead terminals on only one side comprises a plurality of leads connected to a plurality of lead terminals, a semiconductor chip set on an island and having a plurality of pads electrically connected with a plurality of leads on one side, a first extension lead which is connected to one lead terminal among a plurality of leads and at least a part of which is provided along a side of the semiconductor chip perpendicular to the side of it having a plurality of pads, a second extension lead at least a part of which is provided along a side of the semiconductor chip opposite to the side of it having a plurality of pads, and a suspension pin set between one end of the first extension lead and one end of the second extension lead and connected to the island. The semiconductor chip includes a power-supply-voltage pad provided for the side of the semiconductor chip opposite to the side of it having a plurality of pads and electrically connected with the other end of the second extension lead, a first auxiliary pad provided for a side of the semiconductor chip other than the side of it having a plurality of pads and electrically connected to one end of the first extension lead and a second auxiliary pad electrically connected to one end of the second extension lead, and wiring connecting the first auxiliary pad with the second auxiliary pad.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
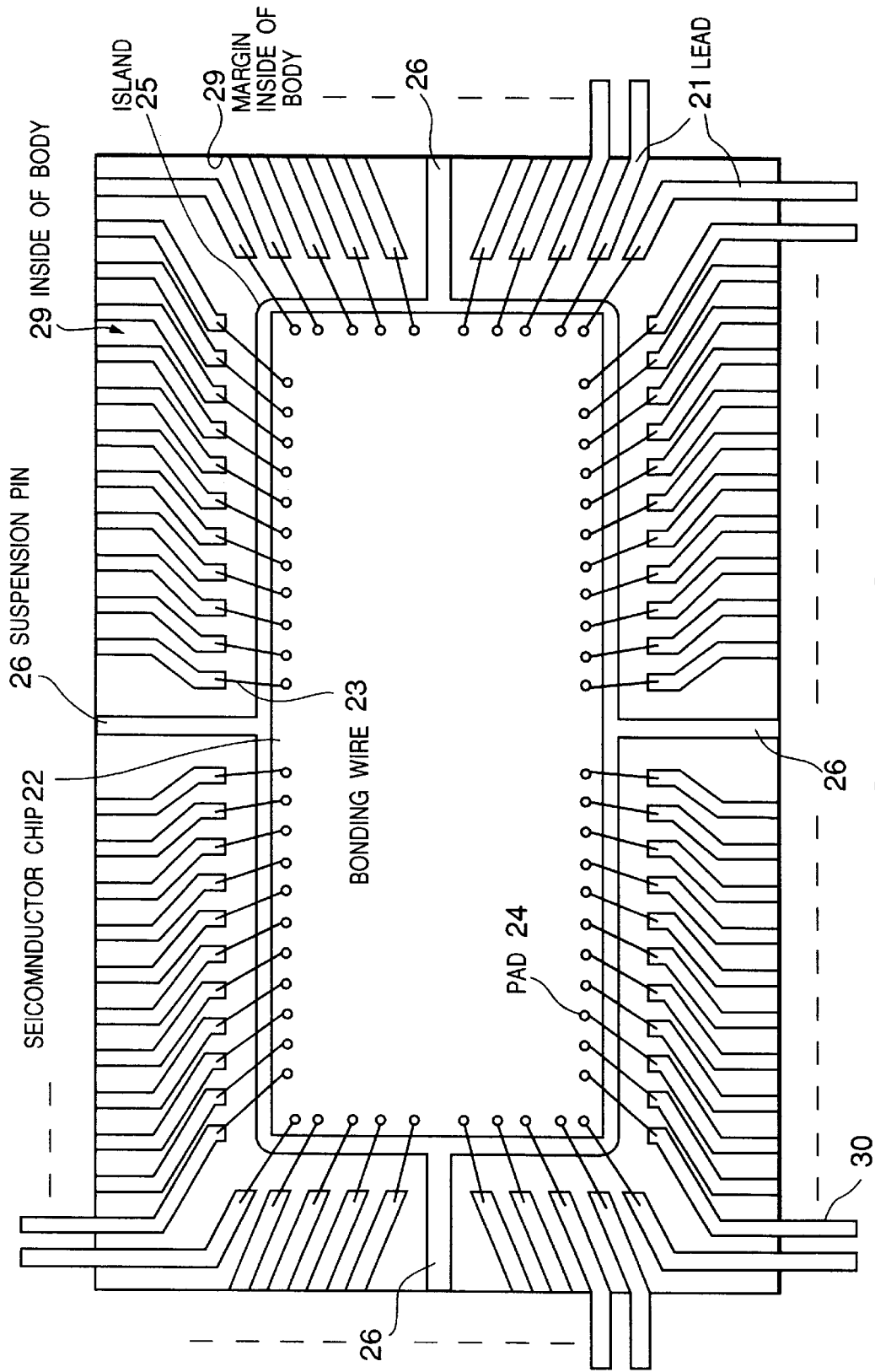
FIG. 1 is a top view of a conventional semiconductor device.
Figure 2:
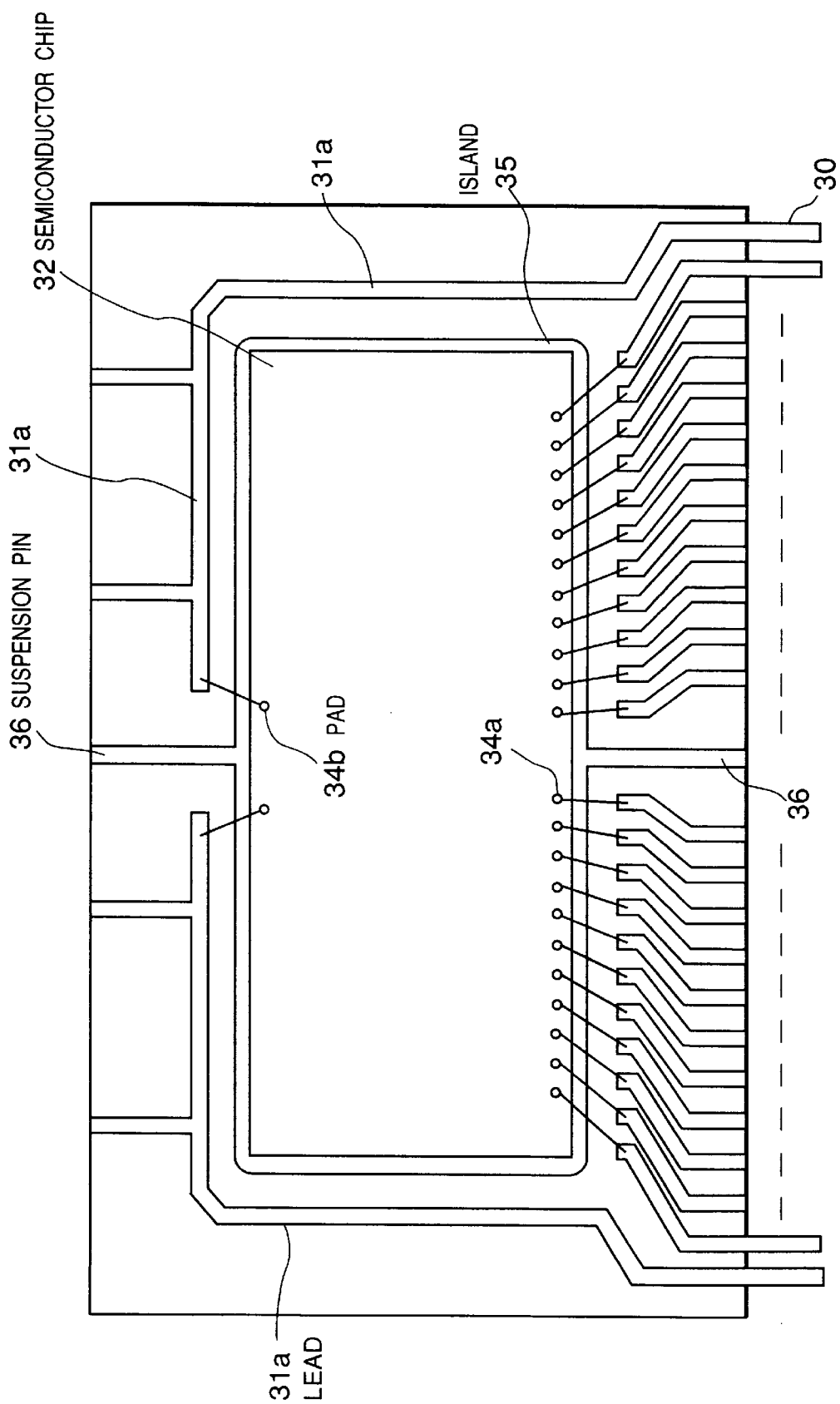
FIG. 2 is a top view of another conventional semiconductor device.

Then, the first embodiment of the present invention is described below by referring to the accompanying drawings. A semiconductor chip 2 is set on an island 5 provided in a quadrangular body 9 made of molded resin. A lot of leads 1a to 1c are arranged around the semiconductor chip 2 in the body 9 and these leads 1a to 1c are electrically connected with pads 4a to 4c provided for the semiconductor chip 2 by bonding wires 3a to 3c.

The island 5 is held in the body 9 by four suspension pins 6 extending from margins 9a to 9c of four sides of the body 9 into the body 9 to bond and secure the semiconductor chip 2 on it.

This embodiment shows a case in which the lead terminal 30 with the lead 1c protruded to the outside of the body 9 is provided for only one side of the semiconductor chip 2 (in the drawing, the margin 9a side). As the pads of the semiconductor chip 2, the pad 4a is provided for the side of the margin 9a inside of the body and moreover, two pads 4b used for power supply voltage and earth voltage respectively are provided for the opposite side. The pad 4a is electrically connected with the lead 1c by the bonding wire 3a. To electrically connect the two opposite-side pads 4b with the lead terminal 30 at the body margin 9a side, the extension lead 1a arranged at the right and left one each is extended and arranged so as to enclose the island 5. The extension lead is divided into extension leads 1a and 1b by the portion of the suspension pin 6 holding the right and left of the island 5.

To electrically connect the divided leads 1a and 1b with each other, two auxiliary pads 4c are provided for the portion of wiring 7 in the wiring pattern of the semiconductor chip 2 and ends $1a_1$ and $1b_1$ of the leads 1a and 1b are connected with each other by the bonding wire 3c. The opposite side pad 4b is connected with an end $1a_2$ of the lead 1a by the bonding wire 3b. In this case, the wiring 7 is formed in the same step as wiring (not illustrated) constituting an internal circuit of a chip 2. The wiring 7 is not electrically connected with any other circuit in the chip but it is independently formed.

Thus, because the lead terminal is present at only one side of the body inside 9 and moreover, the pad 4b of the semiconductor chip 2 is present at the opposite side to the lead terminal, it is possible to electrically connect the leads 1a and 1b with each other by using the wiring 7 which is a part of the wiring pattern on the semiconductor chip 2 even if the lead 1a to be connected with the pad 4b is interrupted by the suspension pin 6 of the island and divided into leads 1a and 1b.

Thus, because the joint of an island can be provided for a necessary portion by using the pattern of a lead frame and the wiring of a semiconductor chip in common, it is possible to stably hold the island also in the resin sealing step and simply arrange the lead frame pattern.

Figure 3:
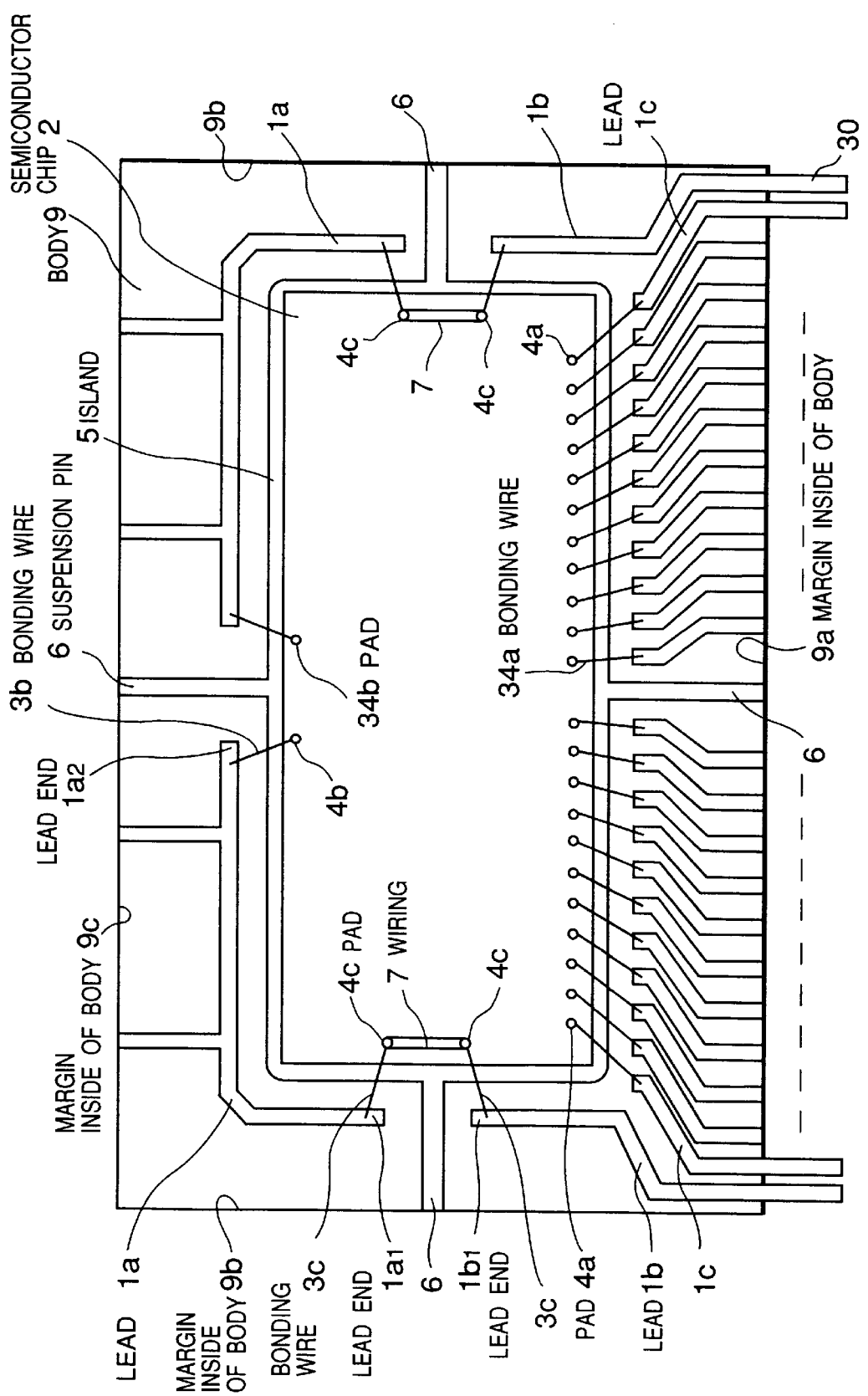
FIG. 3 is a top view of a first embodiment of the present invention.
Figure 4:
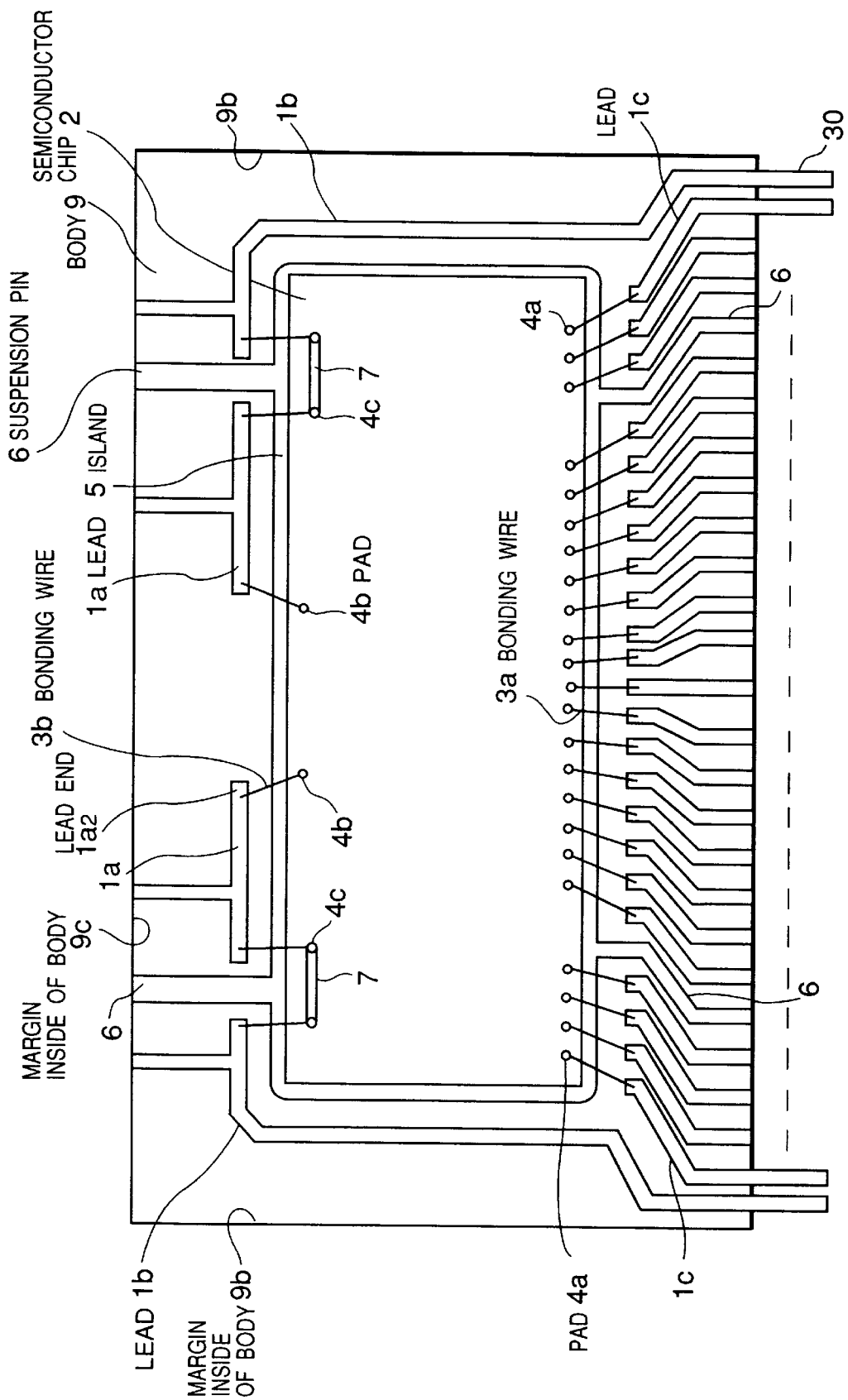
FIG. 4 is a top view of a second embodiment of the present invention.

The second embodiment of the present invention is described below by referring to FIG. 4. In FIG. 4, the same portion as that in FIG. 3 is provided with the same number. This embodiment is different from FIG. 3 in that the positions divided into the lead 1a and the lead 1b are changed by providing two suspension pins 6 for the pad 4a side and two suspension pins 6 for the opposite side to the pad 4a and the positions of the wiring 7 and pad 4c are changed by changing the dividing positions. This embodiment also makes it possible to obtain the same advantage as the first embodiment.

Figure 5:
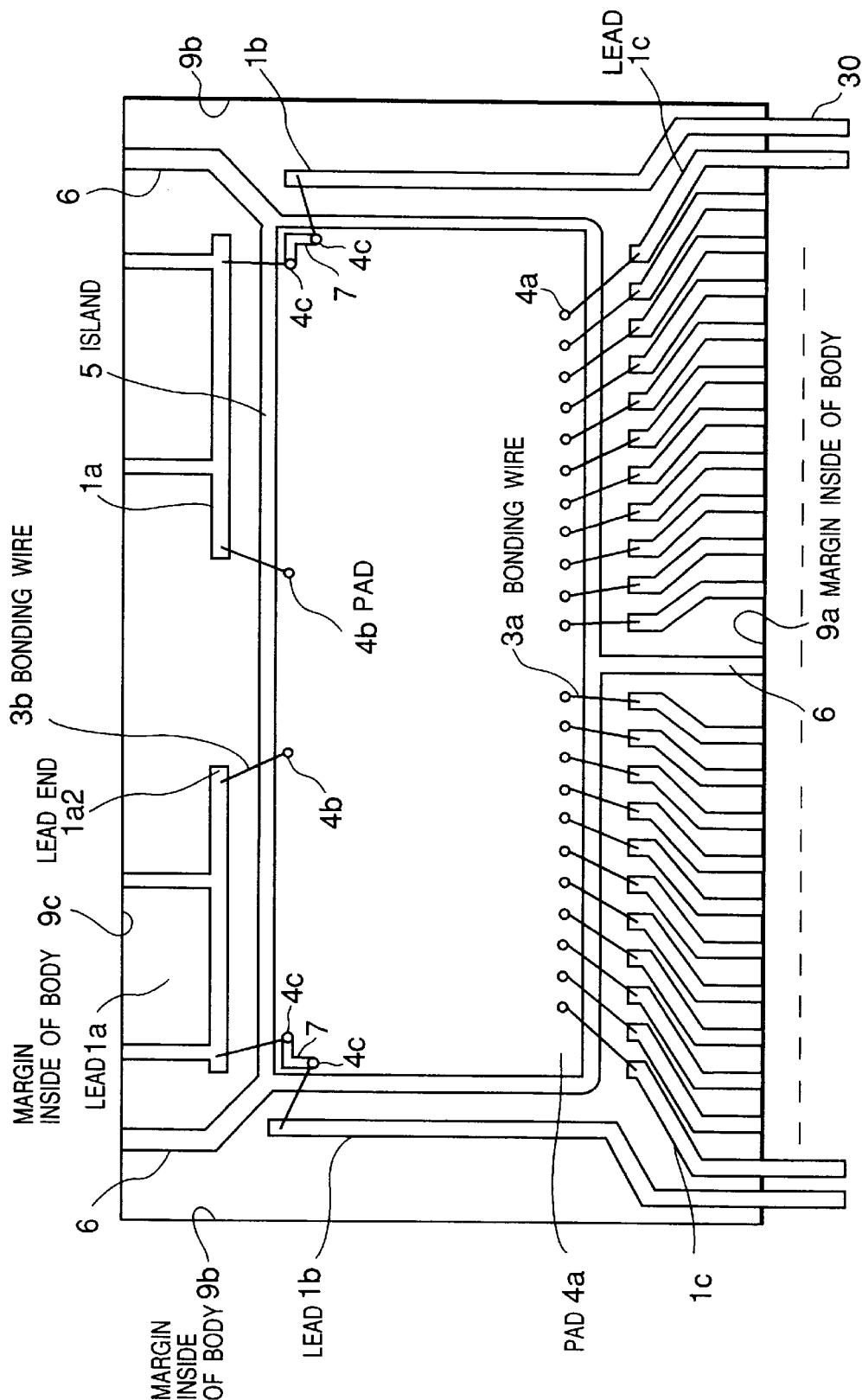
FIG. 5 is a top view of a third embodiment of the present invention.

Then, the second embodiment of the present invention is described below by referring to FIG. 5. In FIG. 5, the same portion as that in FIG. 3 is provided with the same number. This embodiment is different from FIG. 5 in that the positions divided into the lead 1a and lead 1b are changed by setting the positions of two suspension pins 6 to corners of the island 6 and the positions of the wiring 7 and pad 4c are changed by changing the dividing positions. This embodiment also makes it possible to obtain the same advantage as the first embodiment.

Although the invention has been described with reference to specific embodiments, this description does not meet to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device in which a plurality of lead terminals are provided for only one side, comprising:
   a plurality of leads connected to said lead terminals;
   a semiconductor chip set on an island and having a plurality of pads on a first side electrically connected with said leads, a plurality of auxiliary pads, and wiring connecting pairs of said auxiliary pads together;
   a first extension lead which is connected to one lead terminal among said leads and at least a part of which is provided along a second side of said semiconductor chip perpendicular to the first side;
   a second extension lead at least a part of which is provided along a third side of said semiconductor chip opposite to the first side; and
   a suspension pin extending from said island between one end of said first extension lead and one end of said second extension lead;
   wherein said semiconductor chip includes a power-supply-voltage pad on said third side, said power-supply-voltage pad being electrically connected with a second end of said second extension lead, a first said auxiliary pad of one said pair being electrically connected with said one end of said first extension lead and a second said auxiliary pad of said one pair being electrically connected to said one end of said second extension lead.

2. The semiconductor device according to claim 1, wherein the wiring connecting said first auxiliary pad with said second auxiliary pad is electrically independent of other circuits in said semiconductor chip.

3. The semiconductor device according to claim 1, wherein said first auxiliary pad and said second auxiliary pad are along said second side.

4. The semiconductor device according to claim 1, wherein said first auxiliary pad and said second auxiliary pad are along said third side.

5. A semiconductor device in which a plurality of lead terminals are provided for only one side, comprising:
   a plurality of leads connected to said lead terminals,
   a semiconductor chip on an island and having a plurality of pads on one side electrically connected with said leads, a power-supply-voltage pad on an opposite side, a plurality of auxiliary pads and wiring connecting pairs of said auxiliary pads together; and
   an extension lead extending around said semiconductor chip, said extension lead having a first part connected to one of said lead terminals and a second part connected to said power-supply-voltage pad;
   wherein said two parts of said extension lead are each connected to one said auxiliary pad of one of said pairs.

6. The semiconductor device according to claim 5, wherein a suspension pin extends from said island between said two extension lead parts.

7. A semiconductor device according to claim 5, wherein said wiring is electrically independent of other circuits in said semiconductor chip.

* * * * *